(12) United States Patent
Andres et al.

(10) Patent No.: US 9,035,736 B2
(45) Date of Patent: May 19, 2015

(54) MAGNETIC DEVICE HAVING INTEGRATED CURRENT SENSING ELEMENT AND METHODS OF ASSEMBLING SAME

(71) Applicant: General Electric Company, Schenectady, NY (US)

(72) Inventors: Joao Luiz Andres, Murphy, TX (US); John F. Steel, Plano, TX (US); Robert James Catalano, Mesquite, TX (US); Loc Ngo, Carrollton, TX (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 14/306,061

(22) Filed: Jun. 16, 2014

(65) Prior Publication Data

US 2014/0292459 A1 Oct. 2, 2014

Related U.S. Application Data

(63) Continuation of application No. 14/218,093, filed on Mar. 18, 2014.

(60) Provisional application No. 61/805,755, filed on Mar. 27, 2013.

(51) Int. Cl.
*H01F 27/29* (2006.01)
*H01F 27/24* (2006.01)
*H01F 17/04* (2006.01)
*H01F 7/06* (2006.01)
(Continued)

(52) U.S. Cl.
CPC .......... *H01F 27/402* (2013.01); *G01R 19/0092* (2013.01); *H01F 41/02* (2013.01); *Y10T 29/49073* (2015.01); *G01R 15/146* (2013.01)

(58) Field of Classification Search
CPC .......... H01F 41/04; H01F 5/04; H01F 27/292; H01F 27/29; H01F 27/027; H01F 27/2847; H01F 27/2828; H01F 27/2852; H01F 2005/046; H01F 2005/043; H01F 30/16; H01F 30/10
USPC .......... 336/105, 212, 192, 232, 223; 29/602.1, 29/606
See application file for complete search history.

(56) References Cited

U.S. PATENT DOCUMENTS 5,287,083 A  2/1994 Person et al.
6,801,118 B1  10/2004 Ikemoto et al.
(Continued)

FOREIGN PATENT DOCUMENTS

EP  1313109 A2  5/2003
EP  1783788 A2  5/2007
(Continued)

OTHER PUBLICATIONS

Ripka, Pavel, et al., Current Sensor in PCB Technology, IEEE Sensors Journal, Jun. 2005, pp. 433-438, vol. 5, No. 3.

*Primary Examiner* — Mangtin Lian
(74) *Attorney, Agent, or Firm* — General Electric Company

(57) ABSTRACT

A magnetic device is provided. The magnetic device includes a magnetic core and a conductive winding inductively coupled to the magnetic core. The conductive winding includes a first terminal segment, a second terminal segment, and an inductive segment electrically coupled in series therebetween. The first terminal segment includes a current sensing element.

16 Claims, 5 Drawing Sheets

(51) Int. Cl.
*H01F 27/40* (2006.01)
*H01F 41/02* (2006.01)
*G01R 15/14* (2006.01)
*G01R 19/00* (2006.01)

(56) References Cited

U.S. PATENT DOCUMENTS

| | | | |
|---|---|---|---|
| 7,196,506 B2 | 3/2007 | Catona et al. |
| 7,202,694 B2 | 4/2007 | Eberlein |
| 7,265,531 B2 | 9/2007 | Stauth et al. |
| 7,292,022 B2 | 11/2007 | Hirasawa |
| 7,622,910 B2 | 11/2009 | Kojori |
| 7,701,316 B2 | 4/2010 | Teng et al. |
| 8,018,310 B2 | 9/2011 | Hansen et al. |
| 8,080,994 B2 | 12/2011 | Taylor et al. |
| 8,436,500 B2 | 5/2013 | Minato |
| 8,447,275 B2 | 5/2013 | Dearborn |
| 2007/0115700 A1 | 5/2007 | Springett |
| 2008/0074225 A1* | 3/2008 | Hansen et al. ............ 336/83 |
| 2008/0231406 A1* | 9/2008 | Lin et al. ............ 336/200 |

FOREIGN PATENT DOCUMENTS

| | | |
|---|---|---|
| JP | 2001201520 A | 7/2001 |
| WO | 2007108668 A1 | 9/2007 |
| WO | 2012083686 A1 | 6/2012 |

\* cited by examiner

MAGNETIC DEVICE HAVING INTEGRATED CURRENT SENSING ELEMENT AND METHODS OF ASSEMBLING SAME

CROSS-REFERENCE TO RELATED APPLICATIONS

This application is a continuation of U.S. patent application Ser. No. 14/218,093 filed Mar. 18, 2014, which claims the benefit of U.S. Provisional Patent Application No. 61/805,755 filed Mar. 27, 2013, both of which are hereby incorporated by reference in their entirety.

BACKGROUND

The field of the disclosure relates generally to power electronics, and more particularly, to magnetic devices having integrated current sensing elements.

Power electronics systems generally include a printed circuit board and a plurality of electrical components mounted to the printed circuit board to establish an electrical connection between the electrical components. Measuring and monitoring the current flowing through electrical components in power electronic systems is important to prevent overloading, and possibly damaging, the electrical components. Further, as the demand for higher power density electronics systems increases, it becomes increasingly important to utilize board space efficiently.

At least some known devices for measuring current in power electronics systems require a relatively large amount of board space and/or require complex, often costly circuitry to obtain accurate current measurements. For example, some known current sensing devices include discrete current sense resistors mounted to a printed circuit board separate from other electrical components.

Other known current sensing devices utilize four-point terminal measurements on the windings of an electrical component to measure the current flowing through the electrical component. However, such current sensing devices generally require windings having a low thermal coefficient of resistivity and, consequently, a relatively high resistivity. The windings of such electrical components have relatively large cross-sectional areas to compensate for the increased resistance in the windings, and, as a result, such electrical components are typically larger than conventional electrical components.

Yet other known current sensing devices utilize discrete or dedicated current sensing circuitry to measure current flowing through one or more electrical components. Such current sensing circuitry generally requires additional board space and/or requires additional cost to implement into an electronics system. Moreover, the accuracy of such current sensing circuitry is susceptible to temperature changes in the electrical components.

BRIEF DESCRIPTION

In one aspect, a magnetic device is provided that includes a magnetic core and a conductive winding inductively coupled to the magnetic core. The conductive winding includes a first terminal segment, a second terminal segment, and an inductive segment electrically coupled in series therebetween. The first terminal segment includes a current sensing element.

In another aspect, a printed circuit board assembly is provided that includes a printed circuit board and a magnetic device coupled to the printed circuit board. The magnetic device includes a magnetic core and a conductive winding inductively coupled to the magnetic core. The conductive winding includes a first terminal segment, a second terminal segment, an inductive segment electrically coupled in series therebetween, and a current sensing element. The first and second terminal segments are configured to space the magnetic core a distance from the printed circuit board.

In yet another aspect, a method of assembling a magnetic device is provided. The method includes providing a magnetic core, providing a conductive winding including a first terminal segment, a second terminal segment, and an inductive segment electrically coupled in series therebetween, providing a current sensing element within the first terminal segment, and inductively coupling the conductive winding to the magnetic core.

Although specific features of various embodiments may be shown in some drawings and not in others, this is for convenience only. Any feature of any drawing may be referenced and/or claimed in combination with any feature of any other drawing.

DETAILED DESCRIPTION

Example embodiments of magnetic devices are described herein. A magnetic device includes a magnetic core and a conductive winding inductively coupled to the magnetic core. The conductive winding includes a first terminal segment, a second terminal segment, and an inductive segment electrically coupled in series therebetween. The first terminal segment includes a current sensing element.

The embodiments described herein provide a magnetic device having a current sensing element integrated into a conductive winding. As compared to some known current measuring devices, the magnetic devices described herein facilitate reducing the number of discrete electrical components needed to assemble a power electronics system having a current measuring device. Further, as compared to some known current measuring devices, the magnetic devices described herein facilitate efficient use of circuit board space, while also providing thermally stable, accurate current measurements.

Figure 1:
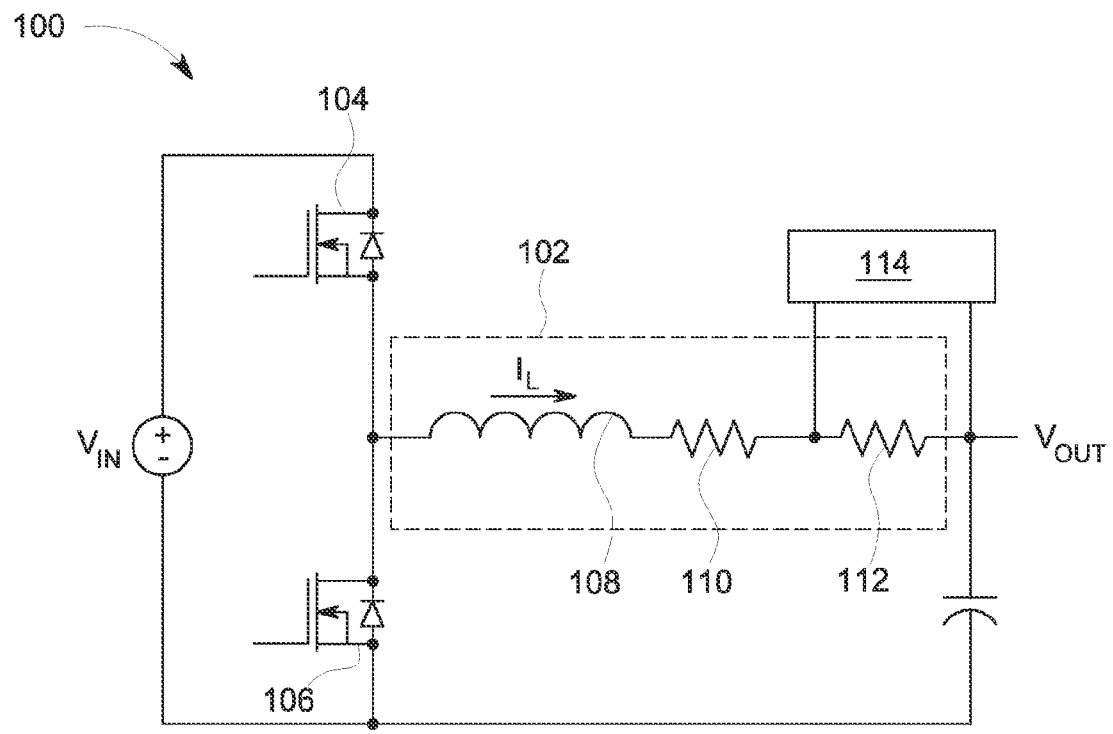
FIG. 1 is a schematic view of an example electronics system that includes a magnetic device.

FIG. 1 is a schematic view of an example electronic circuit 100 that includes an example magnetic device 102 of the present disclosure. In the example embodiment, electronic circuit 100 is a buck switch-mode power converter configured to convert an input voltage $V_{in}$ to an output voltage $V_{out}$. Electronic circuit 100 includes a first switching device 104, a second switching device 106, and magnetic device 102. In the example embodiment, magnetic device 102 is an inductor assembly including an inductor 108 having a direct current resistance 110, and a current sensing element 112 integrated within magnetic device 102. First switching device 104 and second switching device 106 are switched between open and closed positions in opposite phases to produce output voltage $V_{out}$. In the example embodiment, first switching device 104 and second switching device 106 are transistor switches (specifically, MOSFETs), and are coupled to one or more controllers (not shown) configured to output a pulse-width modulated control signal to the gate side of each switching device 104 and 106.

Although magnetic device 102 is described with reference to a buck switch-mode power converter, the magnetic devices of the present disclosure may be implemented in any suitable electrical architecture that enables the magnetic devices to function as described herein. Further, while magnetic device 102 is described as an inductor assembly, the magnetic devices of the present disclosure and the specific features thereof may be embodied in any suitable electrical components that enable the magnetic devices to function as described herein, including, for example, integrated magnetic transformer assemblies and multiple inductor assemblies.

Current sensing element 112 is coupled to electronic circuit 100 in a four-terminal sensing configuration (also referred to as a four-terminal Kelvin type connection, a four-wire sensing connection, and a four-point probe connection) such that a current $I_L$ flowing through inductor 108 can be determined by measuring a voltage difference across current sensing element 112. More specifically, current sensing element 112 is electrically coupled in series with inductor 108 and electrically coupled in parallel with a processing device 114 configured to compute and/or monitor current $I_L$ flowing through inductor 108 based on the voltage difference across current sensing element 112 using known relationships between current, resistance, and voltage. Processing device 114 can also be configured to terminate power supplied to electronic circuit 100 when the detected current $I_L$ satisfies certain conditions (e.g., exceeding a threshold current).

Figure 2:
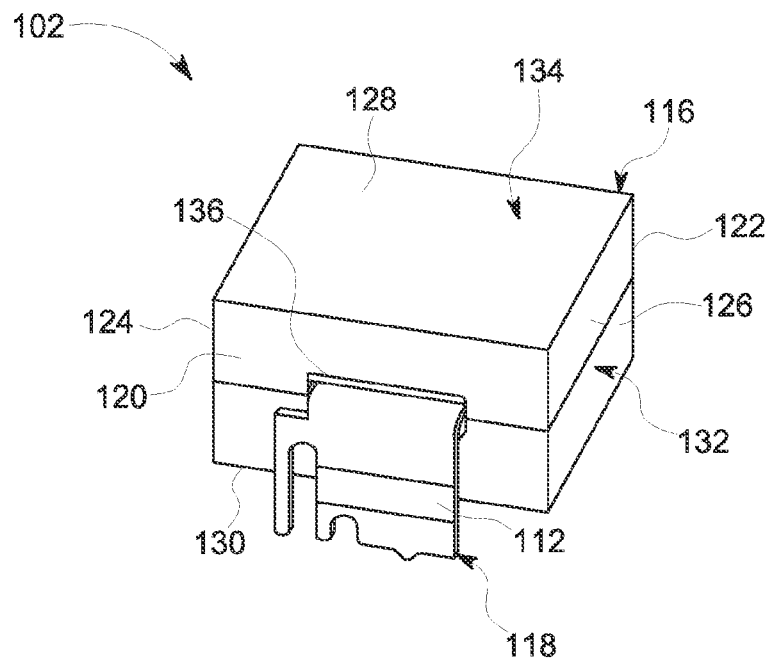
FIG. 2 is a perspective view of the magnetic device shown in FIG. 1 that includes a current sensing element integrally formed with a conductive winding.
Figure 3:
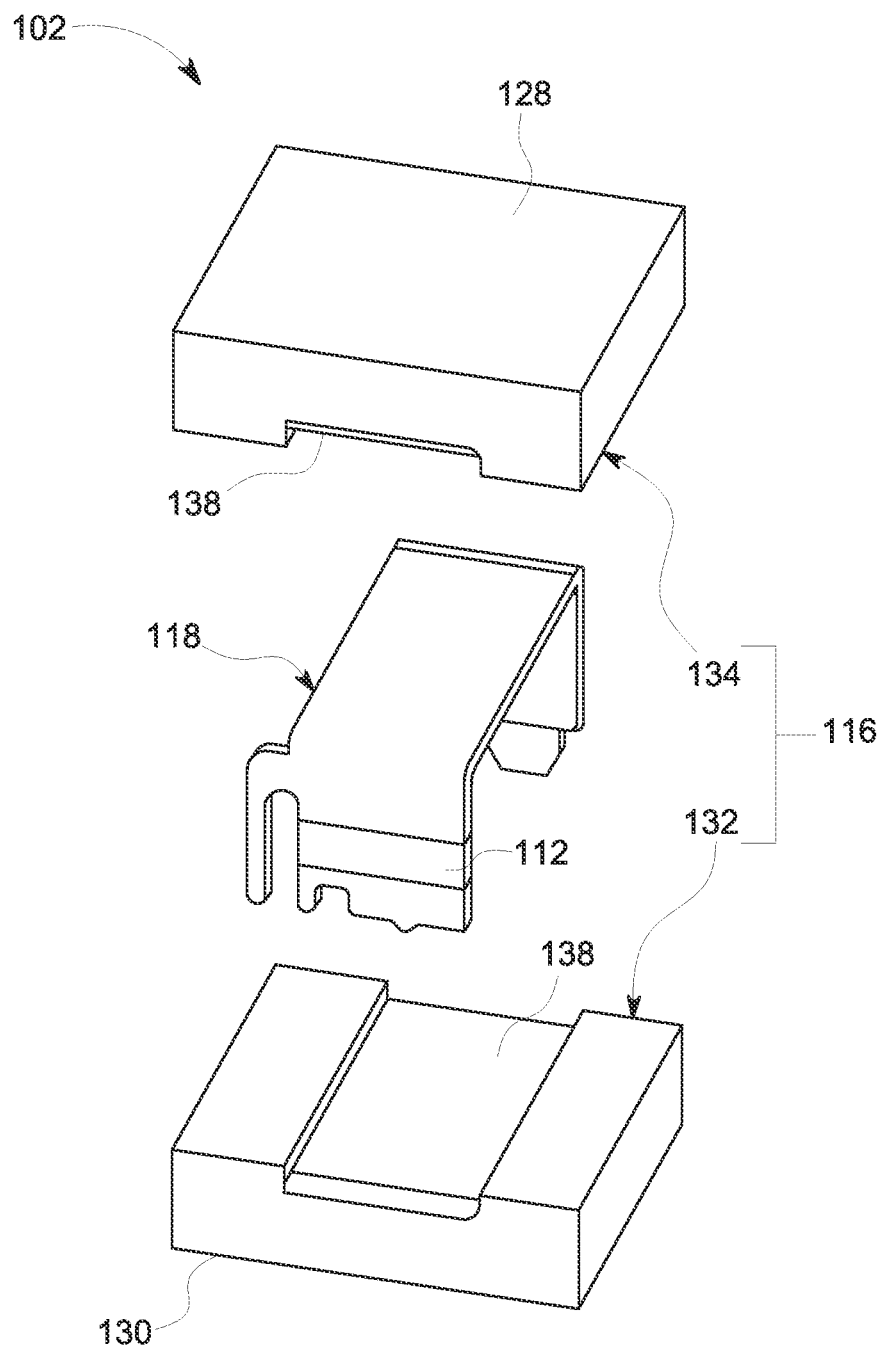
FIG. 3 is an exploded view of the magnetic device shown in FIG. 2.

FIG. 2 is a perspective view of magnetic device 102, and FIG. 3 is an exploded view of magnetic device 102. In the example embodiment, magnetic device 102 includes a magnetic core 116, a conductive winding 118 inductively coupled to magnetic core 116 to form inductor 108 (FIG. 1), and current sensing element 112 integrally formed with conductive winding 118.

In the example embodiment, magnetic core 116 has a generally rectangular shape including six sides. The six sides of magnetic core 116 include a first side 120, an opposing second side 122, first and second opposing ends 124 and 126 extending between first side 120 and second side 122, and a top 128 and an opposing bottom 130 extending between first side 120 and second side 122 and between first end 124 and second end 126. The terms "top" and "bottom" are used herein with reference to the orientation of magnetic core 116 when mounted to a mounting surface, such a printed circuit board. Thus, when magnetic device 102 is mounted to a mounting surface, bottom 130 faces towards the mounting surface and top 128 faces away from the mounting surface. In alternative embodiments, magnetic core 116 may have any suitable shape and any suitable number of sides that enables magnetic device 102 to function as described herein.

In the example embodiment, magnetic core 116 includes a first piece 132, a second piece 134, and an opening 136 defined within magnetic core 116. In the example embodiment, first piece 132 and second piece 134 are each fabricated as unitary magnetic blocks. First piece 132 and second piece 134 are fabricated from any suitable magnetic material that enables magnetic device 102 to function as described herein including, for example, ferrite. In the example embodiment, first piece 132 defines bottom 130 of magnetic core 116 and second piece 134 defines top 128 of magnetic core 116. Further, first piece 132 and second piece 134 collectively define first side 120, second side 122, first end 124, and second end 126.

In the example embodiment, opening 136 extends through magnetic core 116 from first side 120 to second side 122. Opening 136 is configured to receive a portion of conductive winding 118, as described in more detail herein. Further, in the example embodiment, opening 136 is defined by corresponding channels 138 formed in first piece 132 and second piece 134 of magnetic core 116. In alternative embodiments, opening 136 may be formed by a single channel formed in only one of first piece 132 and second piece 134. In further alternative embodiments, opening 136 may extend through magnetic core 116 from any side to any side, including the same side.

Conductive winding 118 is inductively coupled to magnetic core 116. In the example embodiment, conductive winding 118 is inductively coupled to magnetic core 116 to form inductor 108, as noted above. Conductive winding 118 is formed from a suitably conductive material, including, for example, copper, aluminum, silver, gold, phosphor bronze, and combinations thereof In the example embodiment, conductive winding 118 has a resistivity that is less than a resistivity of current sensing element 112. More specifically, conductive winding 118 has a resistivity in the range of about 10 microohm-centimeters (μΩ-cm) and about 0.1 μΩ-cm, more suitably in the range of about 5 μΩ-cm and about 0.5 μΩ-cm, and, even more suitably, in the range of about 3 μΩ-cm and about 1 μΩ-cm. Conductive winding 118 may be formed, for example, by stamping a desired shape from a copper sheet, and bending conductive winding 118 into a desired configuration.

Figure 4:
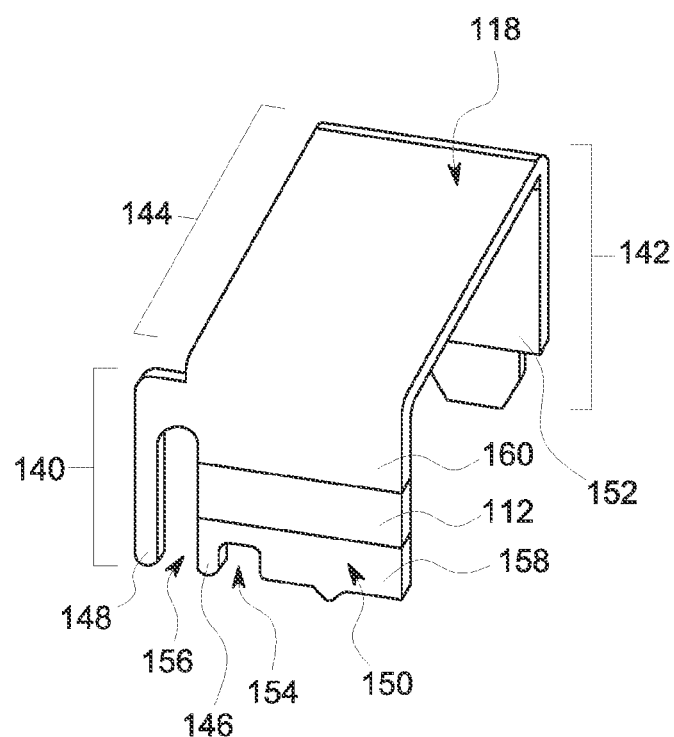
FIG. 4 is a perspective view of the conductive winding and the current sensing element shown in FIGS. 2 and 3.

FIG. 4 is a perspective view of conductive winding 118 and current sensing element 112. In the example embodiment, conductive winding 118 includes a first terminal segment 140, a second terminal segment 142, and an inductive segment 144 electrically coupled in series therebetween. Further, in the example embodiment, current sensing element 112 is integrally formed with conductive winding 118, and disposed within first terminal segment 140. Thus, in the illustrated embodiment, first terminal segment 140 includes current sensing element 112. Further, in the illustrated embodiment, current sensing element 140 is disposed outside of opening 136 in magnetic core 116.

Inductive segment 144 is configured to induce a magnetic field within magnetic core 116. In the example embodiment, inductive segment 144 is disposed within opening 136 of magnetic core 116. First terminal segment 140 and second terminal segment 142 are configured to be electrically coupled to electrical connections external to magnetic device 102. In the example embodiment, first terminal segment 140 and second terminal segment 142 are configured to be electrically coupled to conductive leads of a printed circuit board, for example, by soldering. Further, in the example embodiment, first terminal segment 140 and second terminal segment 142 are oriented substantially parallel to one another, and substantially perpendicular to inductive segment 144. Further, when magnetic device 102 is assembled, first terminal segment 140 and second terminal segment 142 project outward from magnetic core 116, and extend a distance beyond bottom 130 of magnetic core 116.

Further, in the example embodiment, first terminal segment 140 includes a first sensing terminal 146, a second sensing terminal 148, and a first input/output (I/O) terminal 150. Second terminal segment 142 includes a second I/O terminal 152. As described in more detail herein, first sensing terminal 146 and second sensing terminal 148 are configured to measure a voltage difference across current sensing element 112 that is proportional to current $I_L$ (FIG. 1) flowing through conductive winding 118. First and second I/O terminals 150 and 152 are configured to receive an input signal from an electrical component coupled to magnetic device 102, and/or output a signal to an electrical component coupled to magnetic device 102. Moreover, in the example embodiment, first and second I/O terminals 150 and 152 have cross-sectional areas greater than a cross-sectional area of both first sensing terminal 146 and second sensing terminal 148 to provide a lower resistance path to current flowing through conductive winding 118.

In the example embodiment, first sensing terminal 146 is spaced apart from second sensing terminal 148, and conductive winding 118 includes a first notch 154 defined therein and disposed between first sensing terminal 146 and second sensing terminal 148. Further, first I/O terminal 150 is spaced apart from first sensing terminal 146 and second sensing terminal 148, and conductive winding 118 includes a second notch 156 defined therein and disposed between first I/O terminal 150 and first sensing terminal 146.

Current sensing element 112 is coupled between first sensing terminal 146 and second sensing terminal 148 and configured such that, in response to current $I_L$ flowing through conductive winding 118, a voltage difference between first sensing terminal 146 and second sensing terminal 148 is proportional to a voltage drop across current sensing element 112, and the current $I_L$ flowing through conductive winding 118. Moreover, current sensing element 112 has a resistivity greater than the resistivity of conductive winding 118, and a thermal coefficient of resistivity less than the thermal coefficient of resistivity of conductive winding 118. Thus, current sensing element 112 has a relatively high, thermally stable resistance compared to conductive winding 118, and, as such, facilitates accurate current measurements using four-terminal sensing measurement techniques.

Current sensing element 112 can have any suitable resistivity that enables magnetic device 102 to function as described herein, such as a resistivity that is at least about one order of magnitude greater than the resistivity of conductive winding 118. In one suitable embodiment, for example, current sensing element 112 has a resistivity in the range of about 10 μΩ-cm and about 200 μΩ-cm, more suitably in the range of about 20 μΩ-cm and about 100 μΩ-cm, and, even more suitably, in the range of about 30 μΩ-cm and about 60 μΩ-cm. Moreover, in another suitable embodiment, current sensing element 112 has a thermal coefficient of resistivity less than about 500 parts per million (ppm) per degree Celsius (ppm/° C.), more suitably less than about 300 ppm/° C., and, even more suitably, less than about 100 ppm/° C. Suitable materials from which current sensing element 112 may be formed include, for example, copper-manganese-nickel alloys, nickel-chromium alloys, manganese-copper alloys, iron-chromium-aluminum alloys, copper-nickel alloys, and combinations thereof.

Current sensing element 112 divides first terminal segment 140 into a first portion 158 and a second portion 160. When a current flows through conductive winding 118, the voltage drop across current sensing element 112 creates a voltage difference between first portion 158 of first terminal segment 140 and second portion 160 of first terminal segment 140. Depending on how magnetic device 102 is incorporated into an electronic circuit, first portion 158 may have a higher voltage than second portion 160, or first portion 158 may have a lower voltage than second portion 160. First sensing terminal 146 is coupled to first portion 158 of first terminal segment 140, and second sensing terminal 148 is coupled to second portion 160 of first terminal segment 140 in order to detect the voltage drop across current sensing element 112. First sensing terminal 146 and second sensing terminal 148 can be electrically coupled to processing device 114 (FIG. 1) to compute and/or monitor current $I_L$ flowing through conductive winding 118 based on the detected voltage drop across current sensing element 112.

In one suitable embodiment, current sensing element 112 is integrally formed with conductive winding 118 by welding a resistive sheet of material from which current sensing element 112 is formed to two conductive sheets of material such that the resistive sheet of material is disposed between and interconnects the two sheets of conductive material. The welded sheets of material are then stamped to form conductive windings 118 having current sensing elements 112 integrally formed therein. The stamped conductive windings are then bent to obtain a desired orientation of the windings. In the illustrated embodiment, current sensing element 112 is integrally formed with conductive winding 118 such that current sensing element 112 only extends across first I/O terminal 150 and first sensing terminal 146.

Figure 5:
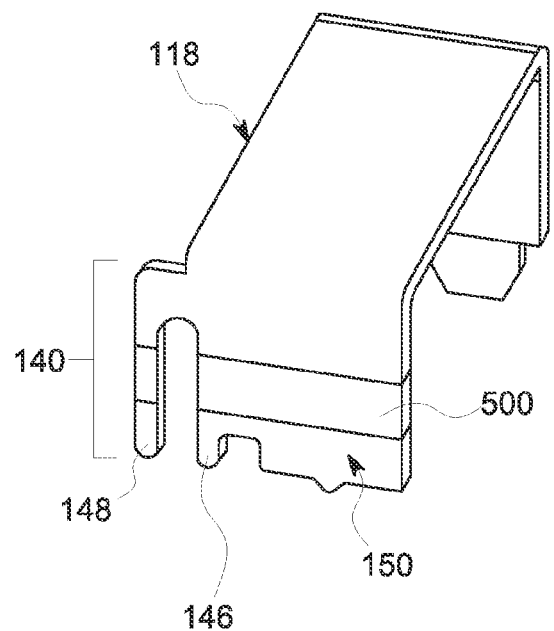
FIG. 5 is perspective view of an alternative current sensing element integrally formed with the conductive winding of FIG. 4.

FIG. 5 is a perspective view of an alternative current sensing element 500 and conductive winding 118. In the embodiment shown in FIG. 5, current sensing element 500 is integrally formed with conductive winding 118 such that current sensing element 500 extends across first I/O terminal 150, first sensing terminal 146, and second sensing terminal 148.

Figure 6:
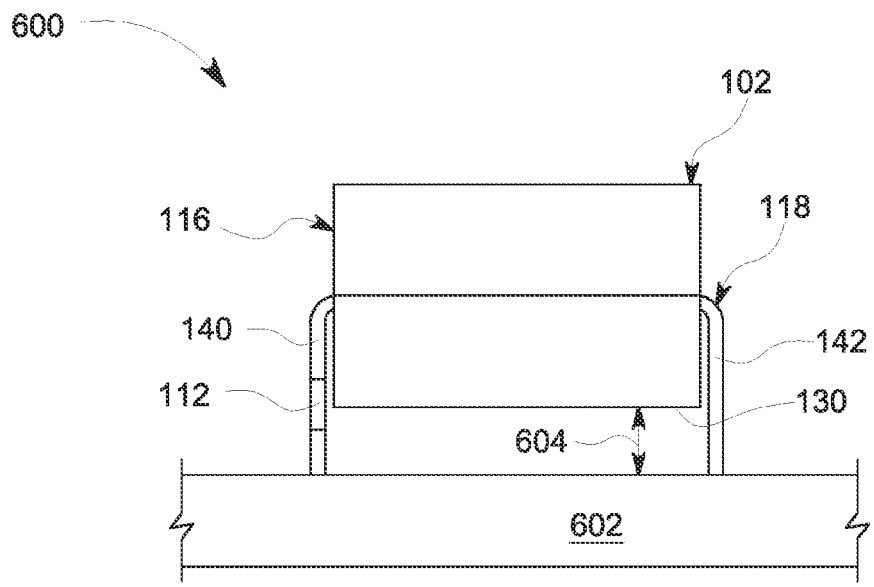
FIG. 6 is a partial side view of a printed circuit board (PCB) assembly and the magnetic device shown in FIGS. 2 and 3.

FIG. 6 is a partial side view of a printed circuit board (PCB) assembly 600 including a printed circuit board 602 and magnetic device 102. PCB assembly 600 may include other electrical components (not shown) coupled to printed circuit board 602 and magnetic device 102 via conductive interconnects on printed circuit board 602.

Magnetic device 102 is mounted to printed circuit board 602 via conductive winding 118. In the example embodiment, first sensing terminal 146, second sensing terminal 148, first I/O terminal 150, and second I/O terminal are coupled to electrical leads or contacts (not shown) on printed circuit board 602 to establish an electrical connection between magnetic device 102 and other electrical components coupled to printed circuit board 602. First sensing terminal 146, second sensing terminal 148, first I/O terminal 150, and second I/O terminal 152 are electrically coupled to printed circuit board 602 such that a voltage difference across current sensing element 112 can be measured to determine a current flowing through conductive winding 118.

As shown in FIG. 6, first terminal segment 140 and second terminal segment 142 of conductive winding 118 are configured to space magnetic core 116 a distance 604 from printed circuit board 602 when magnetic device 102 is coupled to printed circuit board 602. In the example embodiment, first and second terminal segments 140 and 142 extend beyond bottom 130 of magnetic core 116 a distance sufficient to provide a desired spacing when magnetic device 102 is coupled to printed circuit board 602. Moreover, in the example embodiment, distance 604 between magnetic core 116 and printed circuit board 602 is sufficient such that other electrical components can be mounted to printed circuit board 602 between magnetic core 116 and printed circuit board 602.

The configuration of magnetic device 102 thereby facilitates more efficient use of printed circuit board 602.

Figure 7:
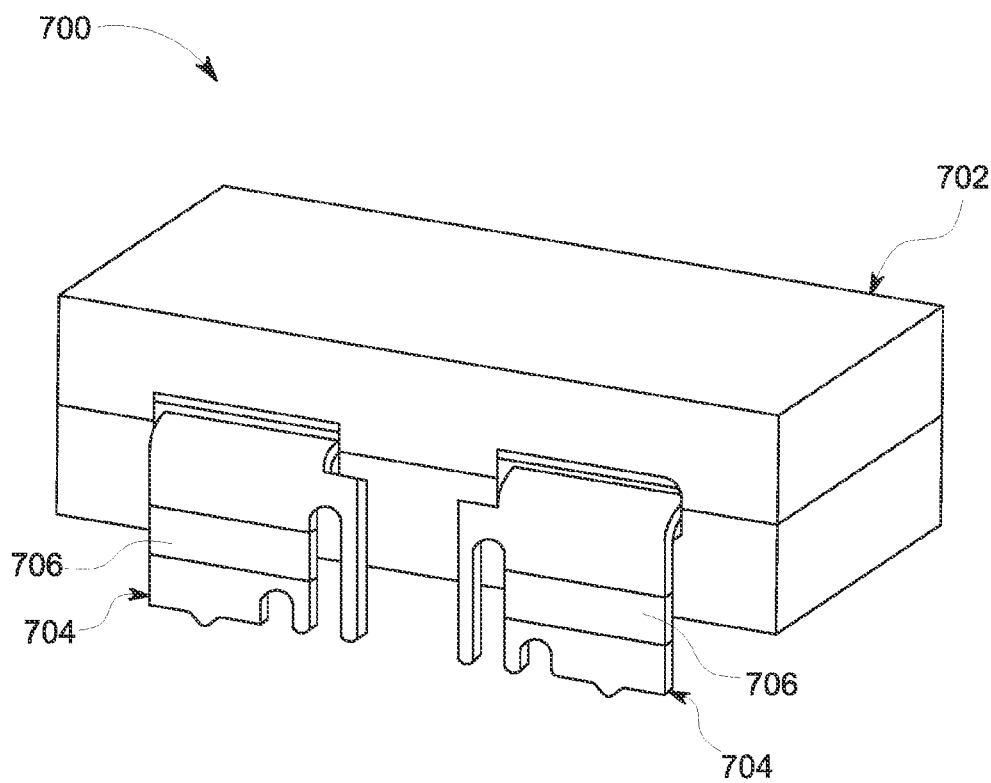
FIG. 7 is a perspective view of an alternative magnetic device.

FIG. 7 is a perspective view of an alternative magnetic device 700. As noted above, the magnetic devices of the present disclosure and the specific features thereof may be embodied in any suitable electrical components that enable the magnetic devices to function as described herein. Magnetic device 700 is a dual inductor assembly including a magnetic core 702, two conductive windings 704 inductively coupled to magnetic core 702, and two current sensing elements 706 each integrally formed within a respective one of conductive windings 704. Conductive windings 704 are substantially identical to conductive winding 118 described herein with reference to FIGS. 2-4, and current sensing elements 706 are substantially identical to current sensing element 112 described herein with reference to FIGS. 2-4.

Figure 8:
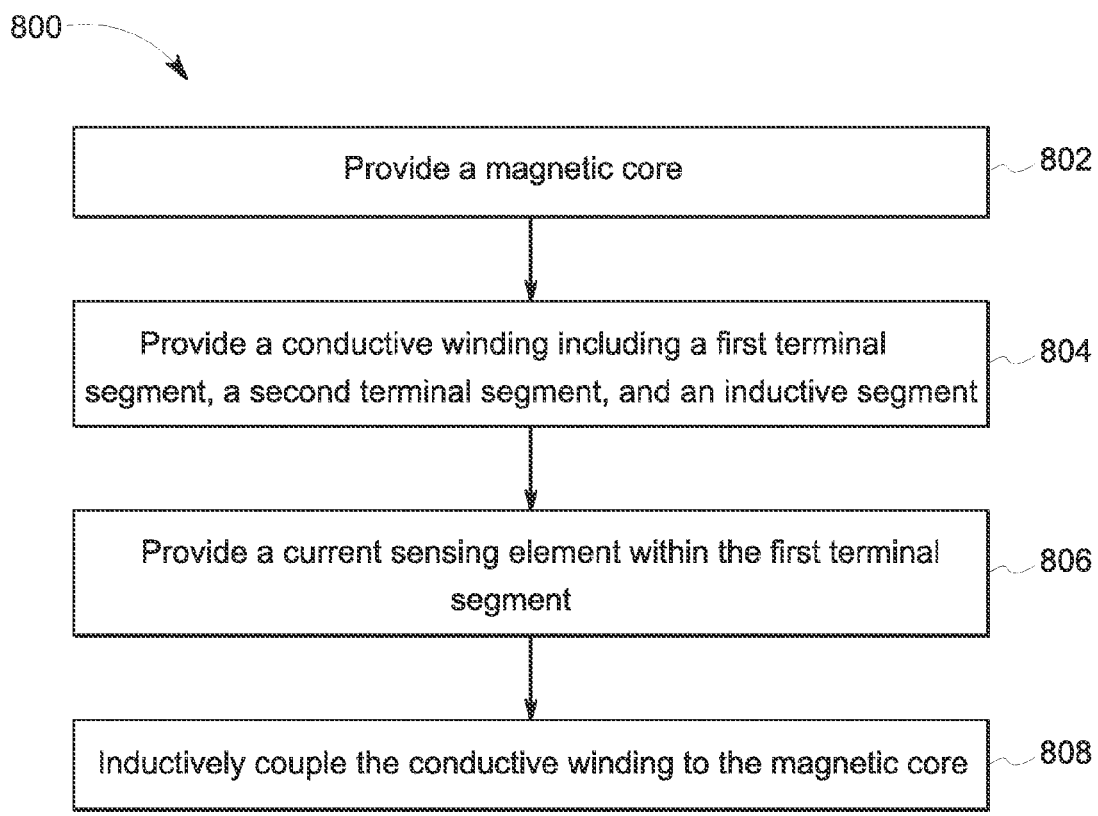
FIG. 8 is a flowchart of an example method of assembling a magnetic device.

FIG. 8 is a flowchart of an example method 800 of assembling a magnetic device, such as magnetic device 102 shown in FIGS. 2 and 3. A magnetic core, such as magnetic core 116 is provided 802. A conductive winding, such as conductive winding 118, is provided 804. The conductive winding includes a first terminal segment, such as first terminal segment 140, a second terminal segment, such as second terminal segment 142, and an inductive segment electrically coupled in series therebetween, such as inductive segment 144. A current sensing element, such as current sensing element 112, is provided 806 within the first terminal segment. The conductive winding is inductively coupled 808 to the magnetic core.

Figure 9:
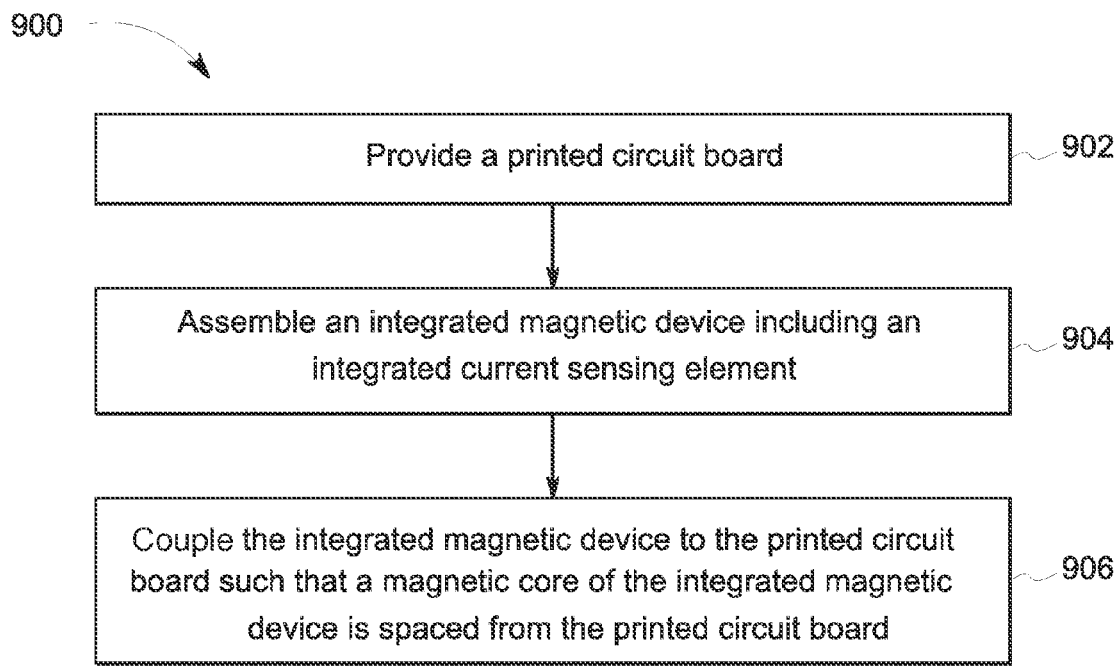
FIG. 9 is a flowchart of an example method for assembling a printed circuit board assembly.

FIG. 9 is a flowchart of an example method 900 of assembling a printed circuit board assembly, such as PCB assembly 600 shown in FIG. 6. A printed circuit board, such as printed circuit board 602, is provided 902. A magnetic device having an integrated current sensing element is assembled 904 in accordance with method 800. The magnetic device is coupled 906 to the printed circuit board (e.g., by coupling the first and second terminal segments of the conductive winding to the printed circuit board) such that the magnetic core is spaced from the printed circuit board by a distance greater than a thickness of the conductive winding.

Example embodiments of magnetic devices are described herein. A magnetic device includes a magnetic core and a conductive winding inductively coupled to the magnetic core. The conductive winding includes a first terminal segment, a second terminal segment, and an inductive segment electrically coupled in series therebetween. The first terminal segment includes a current sensing element.

As compared to some known current measuring devices, the magnetic devices described herein facilitate reducing the number of discrete electrical components needed to assemble a power electronics circuit with a current measuring device. Further, as compared to some known current measuring devices, the magnetic devices described herein facilitate efficient use of circuit board space, while also providing thermally stable, accurate current measurements.

The order of execution or performance of the operations in the embodiments of the invention illustrated and described herein is not essential, unless otherwise specified. That is, the operations may be performed in any order, unless otherwise specified, and embodiments of the invention may include additional or fewer operations than those disclosed herein. For example, it is contemplated that executing or performing a particular operation before, contemporaneously with, or after another operation is within the scope of aspects of the invention.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A magnetic device comprising:
a magnetic core; and
a conductive winding inductively coupled to said magnetic core, said conductive winding comprising a first terminal segment, a second terminal segment, and an inductive segment electrically coupled in series therebetween, said first terminal segment comprising a first sensing terminal, a second sensing terminal spaced from said first sensing terminal, an input/output terminal spaced from said first and second sensing terminals, and a current sensing element electrically coupled between said first and second sensing terminals, wherein said conductive winding defines a first notch disposed between said first and second sensing terminals, and a second notch disposed between said input/output terminal and at least one of said first and second sensing terminals.

2. A magnetic device in accordance with claim 1, wherein said current sensing element is configured such that, in response to a current flowing through said conductive winding, a voltage difference between said first and second sensing terminals is proportional to the current.

3. A magnetic device in accordance with claim 1, wherein said current sensing element divides said first terminal segment into a first portion and a second portion, said first sensing terminal being coupled to said first portion, and said second sensing terminal being coupled to said second portion.

4. A magnetic device in accordance with claim 1, wherein said input/output terminal has a cross-sectional area greater than a cross-sectional area of each of said first and second sensing terminals.

5. A magnetic device in accordance with claim 1, wherein said magnetic core has an opening defined therein, and said inductive segment is disposed within said opening.

6. A magnetic device in accordance with claim 5, wherein said current sensing element is disposed outside of said opening.

7. A magnetic device in accordance with claim 1, wherein said current sensing element has a resistivity greater than a resistivity of said conductive winding.

8. A printed circuit board assembly comprising:
a printed circuit board; and
a magnetic device coupled to said printed circuit board, said magnetic device comprising:
a magnetic core; and
a conductive winding inductively coupled to said magnetic core, said conductive winding comprising a first terminal segment, a second terminal segment, and an inductive segment electrically coupled in series therebetween, said first terminal segment comprising a first sensing terminal, a second sensing terminal spaced from said first sensing terminal, an input/output terminal spaced from said first and second sensing terminals, and a current sensing element electrically coupled between said first and second sensing terminals, wherein said conductive winding defines a first notch disposed between said first and second sensing terminals, and a second notch disposed between said input/output terminal and at least one of said first and second sensing terminals, wherein said first and second terminal segments are configured to space said magnetic core a distance from said printed circuit board, wherein said distance is greater than a thickness of said conductive winding.

9. A printed circuit board assembly in accordance with claim 8, wherein said current sensing element is configured such that, in response to a current flowing through said conductive winding, a voltage difference between said first and second sensing terminals is proportional to the current.

10. A printed circuit board assembly in accordance with claim 9, wherein said current sensing element divides said first terminal segment into a first portion and a second portion, said first sensing terminal being coupled to said first portion and said second sensing terminal being coupled to said second portion.

11. A printed circuit board assembly in accordance with claim 9, wherein said first terminal segment further comprises an input/output terminal having a cross-sectional area greater than a cross-sectional area of each of said first and second sensing terminals.

12. A printed circuit board assembly in accordance with claim 8, wherein said current sensing element has a resistivity greater than a resistivity of said conductive winding.

13. A method of assembling a magnetic device, said method comprising:

providing a magnetic core;

providing a conductive winding including a first terminal segment, a second terminal segment, and an inductive segment electrically coupled in series therebetween, the first terminal segment including a first sensing terminal, a second sensing terminal spaced from the first sensing terminal, and an input/output terminal spaced from the first and second sensing terminals, the conductive winding defining a first notch disposed between the first and second sensing terminals, and a second notch disposed between the input/output terminal and at least one of the first and second sensing terminals;

electrically coupling a current sensing element between the first and second sensing terminals of the first terminal segment; and inductively coupling the conductive winding to the magnetic core.

14. A method of assembling a magnetic device in accordance with claim 13, wherein the magnetic core has an opening defined therein, wherein inductively coupling the conductive winding comprises positioning the inductive segment within the opening.

15. A method of assembling a magnetic device in accordance with claim 14 further comprising positioning the current sensing element outside of the opening.

16. A method of assembling a magnetic device in accordance with claim 13, said method further comprising:

providing a printed circuit board; and coupling the first terminal segment and the second terminal segment to the printed circuit board such that the magnetic core is spaced from the printed circuit board by a distance greater than a thickness of the conductive winding.

* * * * *